United States Patent
Zheng et al.

(10) Patent No.: US 9,419,174 B2
(45) Date of Patent: Aug. 16, 2016

(54) TRANSPARENT QUANTUM DOT LIGHT-EMITTING DIODES WITH DIELECTRIC/METAL/DIELECTRIC ELECTRODE

(71) Applicant: UNIVERSITY OF FLORIDA RESEARCH FOUNDATION, INC., Gainesville, FL (US)

(72) Inventors: Ying Zheng, Redmond, WA (US); Weiran Cao, Gainesville, FL (US); Jiangeng Xue, Gainesville, FL (US); Paul H. Holloway, Gainesville, FL (US)

(73) Assignee: UNIVERSITY OF FLORIDA RESEARCH FOUNDATION, INC., Gainesville, FL (US)

( * ) Notice: Subject to any disclaimer, the term of this patent is extended or adjusted under 35 U.S.C. 154(b) by 0 days.

(21) Appl. No.: 14/424,540

(22) PCT Filed: Sep. 26, 2013

(86) PCT No.: PCT/US2013/061870
§ 371 (c)(1),
(2) Date: Feb. 27, 2015

(87) PCT Pub. No.: WO2014/099080
PCT Pub. Date: Jun. 26, 2014

(65) Prior Publication Data
US 2015/0228850 A1  Aug. 13, 2015

Related U.S. Application Data

(60) Provisional application No. 61/705,676, filed on Sep. 26, 2012.

(51) Int. Cl.
*H01L 29/06* (2006.01)
*H01L 33/06* (2010.01)
(Continued)

(52) U.S. Cl.
CPC .............. *H01L 33/06* (2013.01); *C09K 11/565* (2013.01); *C09K 11/883* (2013.01);
(Continued)

(58) Field of Classification Search
None
See application file for complete search history.

(56) References Cited

U.S. PATENT DOCUMENTS 6,326,144 B1  12/2001  Bawendi et al.
6,648,975 B2  11/2003  Suzuki et al.
(Continued)

FOREIGN PATENT DOCUMENTS

CN  101216428  7/2008
JP  2006-261620  9/2006
(Continued)

OTHER PUBLICATIONS

Anikeeva, P.O. et al., "Quantum Dot Light-Emitting Devices with Electroluminescence Tunable over the Entire Visible Spectrum," *Nano Letters*, 2009, pp. 2532-2536, vol. 9, No. 7.
(Continued)

*Primary Examiner* — Benjamin Sandvik
*Assistant Examiner* — Herve Assouman
(74) *Attorney, Agent, or Firm* — Saliwanchik, Lloyd & Eisenschenk

(57) ABSTRACT

Quantum dot light emitting diodes (QD-LEDs) are formed that are transparent and emit light from the top and bottom faces. At least one electrode of the QD-LEDs is a dielectric/metal/dielectric layered structure, where the first dielectric comprises metal oxide nanoparticles or polymer-nanoparticle blends and is 10 to 40 nm in thickness, the metal layer is 5 to 25 nm in thickness, and the second dielectric layer is a nanoparticulate, polymer-nanoparticle blend or continuous layer of 30 to 200 nm in thickness and is situated distal to the light emitting layer of the QD-LED.

18 Claims, 12 Drawing Sheets

(51) Int. Cl.

| | | |
|---|---|---|
| H01L 51/50 | (2006.01) | |
| C09K 11/56 | (2006.01) | |
| C09K 11/88 | (2006.01) | |
| H05B 33/14 | (2006.01) | |
| H05B 33/22 | (2006.01) | |
| H05B 33/26 | (2006.01) | |
| H01L 33/00 | (2010.01) | |
| H01L 33/08 | (2010.01) | |
| H01L 33/26 | (2010.01) | |
| H01L 33/28 | (2010.01) | |
| H01L 33/30 | (2010.01) | |
| H01L 33/40 | (2010.01) | |
| H01L 51/00 | (2006.01) | |

(52) U.S. Cl.
CPC ............ *H01L 33/002* (2013.01); *H01L 33/08* (2013.01); *H01L 33/26* (2013.01); *H01L 33/285* (2013.01); *H01L 33/305* (2013.01); *H01L 33/40* (2013.01); *H01L 51/502* (2013.01); *H05B 33/14* (2013.01); *H05B 33/22* (2013.01); *H05B 33/26* (2013.01); *H01L 51/0037* (2013.01); *H01L 51/0039* (2013.01)

(56) References Cited

U.S. PATENT DOCUMENTS

| | | | |
|---|---|---|---|
| 6,777,869 B2 | 8/2004 | Pavlovsky | |
| 7,173,369 B2 | 2/2007 | Forrest et al. | |
| 7,777,233 B2 | 8/2010 | Kahen et al. | |
| 7,888,700 B2 | 2/2011 | Kahen | |
| 2007/0215856 A1* | 9/2007 | Kwon | B82Y 20/00 257/14 |
| 2007/0222371 A1* | 9/2007 | Raychaudhuri | H01L 51/5234 313/504 |
| 2008/0001538 A1 | 1/2008 | Cok | |
| 2008/0055535 A1 | 3/2008 | Chiba et al. | |
| 2008/0074050 A1* | 3/2008 | Chen | C09K 11/565 313/509 |
| 2008/0218068 A1 | 9/2008 | Cok | |
| 2009/0001403 A1 | 1/2009 | Skipor et al. | |
| 2009/0127576 A1 | 5/2009 | Jang et al. | |
| 2009/0188558 A1* | 7/2009 | Jen | B82Y 10/00 136/256 |
| 2009/0295731 A1 | 12/2009 | Kim et al. | |
| 2009/0321755 A1 | 12/2009 | Jang et al. | |
| 2010/0012168 A1 | 1/2010 | Mihaila et al. | |
| 2010/0090195 A1 | 4/2010 | Parsapour | |
| 2010/0123155 A1 | 5/2010 | Pickett et al. | |
| 2011/0080090 A1* | 4/2011 | Wood | C09K 11/565 313/506 |
| 2011/0127932 A1 | 6/2011 | Halpert et al. | |
| 2011/0261291 A1 | 10/2011 | Park et al. | |
| 2011/0284819 A1 | 11/2011 | Kang et al. | |
| 2012/0138894 A1 | 6/2012 | Qian et al. | |
| 2013/0016499 A1 | 1/2013 | Yee et al. | |

FOREIGN PATENT DOCUMENTS

| | | |
|---|---|---|
| KR | 10-2011-0127897 | 11/2011 |
| KR | 10-2012-0074899 | 7/2012 |
| WO | WO 2009-146262 | 12/2009 |
| WO | WO 2011-051952 | 5/2011 |

OTHER PUBLICATIONS

Caruge, J.M. et al., "Colloidal quantum-dot light-emitting diodes with metal-oxide charge transport layers," *Nature Photonics*, Apr. 2008, pp. 247-250, vol. 2.

Cao, W. et al., "Flexible organic solar cells using an oxide/metal/oxide trilayer as transparent electrode," *Organic Electronics*, 2012, pp. 2221-2228, vol. 13.

Chaudhary, S. et al., "Trilayer hybrid polymer-quantum dot light-emitting diodes," *Applied Physics Letters*, Apr. 12, 2004, pp. 2925-2927, vol. 84, No. 15, Feb. 19, 2016.

Cho, H. et al., "Multilayer transparent electrode for organic light-emitting diodes: tuning its optical characteristics," *Optics Express*, Feb. 15, 2010, pp. 1-11, vol. 18, No. 4.

Cho, K-S. et al., "High-performance crosslinked colloidal quantum-dot light-emitting diodes," *Nature Photonics*, Jun. 2009, pp. 341-345, vol. 3.

Jeon, K. et al., "Fabrication and characterization of $WO_3/Ag/WO_3$ multilayer transparent anode with solution-processed $WO_3$ for polymer light-emitting diodes," *Nanoscale Research Letters*, 2012, pp. 253(1-7), vol. 7.

Qian, L. et al., "Stable and efficient quantum-dot light-emitting diodes based on solution-processed multilayer structures," *Nature Photonics*, Sep. 2011, pp. 543-548, vol. 5.

Tao, C. et al., "Semitransparent inverted polymer solar cells with $MoO_3/Ag/MoO_3$ as transparent electrode," *Applied Physics Letters*, 2009, pp. 053303(1-3), vol. 95.

Wrzesniewski, E. et al., "Transparent oxide/metal/oxide trilayer electrode for use in top-emitting organic light-emitting diodes," *Journal of Photonics for Energy*, 2011, pp. 011023(1-9), vol. 1.

\* cited by examiner

TRANSPARENT QUANTUM DOT LIGHT-EMITTING DIODES WITH DIELECTRIC/METAL/DIELECTRIC ELECTRODE

CROSS-REFERENCE TO RELATED APPLICATIONS

This application is the U.S. national stage cation of International patent application No. PCT/US2013/061870, filed Sep. 26, 2013, which claims the benefit of U.S. Provisional Application Ser. No. 61/705,676, filed Sep. 26, 2012, the disclosures of which are hereby incorporated by reference in their entireties, including any figures, tables, or drawings.

This invention was made with government support under W911NF-07-0545 awarded by the Department of the Army. The government has certain rights in the invention.

BACKGROUND OF INVENTION

Light emitting diodes (LEDs) are increasingly used in modern display technologies. LEDs have many advantages over traditional light sources including: low energy consumption, long lifetime, robustness, small size and fast switching. LEDs remain relatively expensive and require precise current and heat management relative to traditional light sources. Fabrication costs are significant and exceed the material costs for some LEDs. Conventional LEDs are made from inorganic compound semiconductors, typically AlGaAs (red), AlGaInP (orange-yellow-green), and AlGaInN (green-blue), which emit monochromatic light of a frequency corresponding to the band gap of the semiconductor compound used. These conventional LEDs do not emit light of mixed colors, for example, white light. White LEDs can be used as light sources and are capable of producing full color displays with existing color filter technology. One method being used to produce white light is to combine individual LEDs to simultaneously emit the three primary colors, which mix to produce white light. Another method is to use a yellow phosphor to convert monochromatic blue light, or two or more phosphors emitting different colors to convert UV light, from a LED to broad-spectrum white light, although color control is limited by this approach. Organic LEDs (OLEDs) can also be fabricated relatively inexpensively to provide a variety of colors and white light, but OLEDs generally suffer from deficiencies in efficiency and in lifetime relative to inorganic devices as the light-emitting layer, being that of an organic material, typically requires a relatively high current density and driving voltage to achieve high luminance, which promotes degradation of the OLEDs, especially in the presence of oxygen, water and UV photons.

Quantum dot light emitting diodes (QD-LEDs) are being developed for display and lighting devices. Inorganic quantum dot light emitters have a few advantages over OLEDs and other light-emitting diodes, which include stability, solution processability and excellent color purity. Quantum dots (QDs) are semiconductor nanocrystallites whose radii are smaller than the bulk exciton Bohr radius. Quantum confinement of electrons and holes in all three dimensions leads to an increase in the effective band gap of the QDs with decreasing crystallite size, where the optical absorption and emission of quantum dots shift to higher energies (blue shift) as the size of the dots decreases. For example, a CdSe QD can emit light in any monochromatic visible color depending only on the size of the QD and can be used to form QD-LEDs arrays that emit white light.

Current QD-LEDs employ a few layers of organic materials and reactive metals for efficient charge transport and injection. The use of the organics offsets some advantages of QD-LEDs and has discouraged commercialization of QD-LEDs. For instance, Sun et al., *Nature Photonics*, 2007, 1, 717 discloses tris(8-hydroxquinoline)aluminum (Alq3) as an electron transporting layer and calcium as an electron injection layer to obtain an efficient color QD-LED. Unfortunately, long term stability is insufficient due to degradation of the organic layer and oxidation of the reactive metal. Device fabrication requires a costly vacuum deposition method. For most QD-LEDs, defects can occur at the organic-inorganic interface between the QD-emitting layer and an organic electron transport layer, which lead to poor electron injection into the QD-emitting layer. Caruge et al., *Nature Photonics*, 2008, 2, 247 discloses a fully inorganic QD-LED with good long term stability. However, the charge transporting layers are fabricated through complicated and costly vacuum sputter deposition methods.

Cho et al., U.S. Patent Application Publication 20090039764 discloses a QD-LED where a continuous inorganic thin film is used to constitute the electron transport layer instead of an organic thin film. QD-LEDs that use an inorganic thin film electron transport layers are disclosed in, for example: Caruge, et al., *Nature Photonics*, 2, 247, 2008, where the QD-LED is all inorganic materials; Cho et al., *Nature Photonics*, 3, 341, 2009; and Qian et al., *Nature Photonics*, 5, 543, 2011, where the inorganic film consists of nanoparticles. The inorganic thin film can be prepared by a cost effective solution coating process such as spin coating, printing, casting and spraying, followed by a chemical reaction, a sol-gel process, to form the inorganic thin film material after deposition on the light emitting layer. Preparation of all inorganic QD-LEDs with electron transport layer that are nanoparticulate and do not require expensive processing steps for formation of layers by a reaction process is disclosed in Quan et al., US Patent Application Publication, 20120138894, and incorporated herein by reference. Using charge transport layers consisting of oxide materials, or other inorganic materials, with various compositions and structures, can be employed in QD-LEDs to enhance the device performance. For example, inorganic charge transport layers provide higher charge carrier mobility than the organic counterparts and significantly improve the stability of QD-LEDs.

Improvement to QD-LEDs and extension of their use to different display applications is desirable. For example, stable transparent QD-LEDs would be valuable for display applications within windshields for automobiles, trains, and airplanes.

BRIEF SUMMARY

Embodiments of the invention are directed to transparent quantum dot light emitting diodes (QD-LEDs) where the light emitting layer is quantum dots (QDs) and at least one electrode is a dielectric/metal/dielectric (DMD) electrode. The DMD electrode has a first dielectric layer, a thin continuous metal layer, and a second dielectric layer that is either nanoparticulate or a continuous film. Light can be emitted from the top and bottom faces of said QD-LED.

The QDs can be Group II-VI compound semiconductor nanocrystals, Group III-V or IV-VI compound semiconductor nanocrystals, $CuInSe_2$ nanocrystals, metal oxide nanoparticles, core-shell structured nanocrystals, semiconductor nanocrystals doped with rare earth elements or transition metal elements or any combination thereof.

The DMD electrode has a first particulate dielectric layer of 5 to 60 nm in thickness and a metal layer of about 5 to about 20 nm in thickness and is continuous so that it has a low sheet resistance yet is sufficiently transparent. The second dielectric layer is distal to the light emitting layer and can be either particulate or continuous.

DETAILED DISCLOSURE

Figure 1:
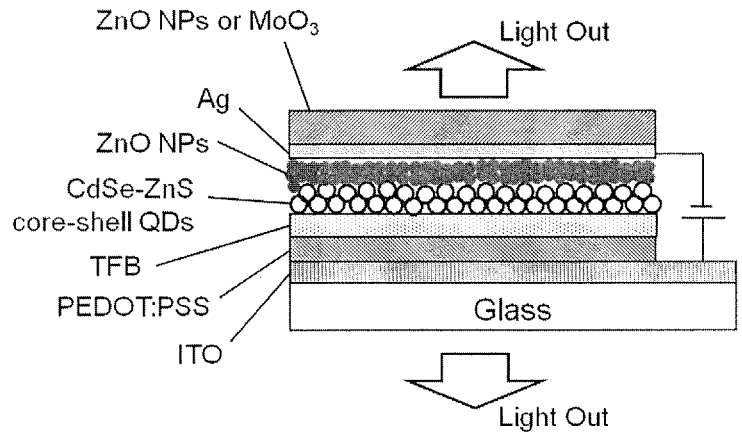
FIG. 1 shows a representation of the layered structure of a transparent QD-LED with a ZnO NP (35 nm)/Ag film (15 nm)/MoO$_3$ film (40 nm) DMD electrode, according to an embodiment of the invention.

Embodiments of the invention are directed to transparent QD-LEDs that incorporate an electrode consisting of a layer of dielectric, a thin metal layer and an additional layer of dielectric, a DMD structure. Transparent QD-LEDs can be integrated with transparent display systems, owing to the high optical transparency of the thin QDs and carrier transport layers. Transparent QD-LEDs can be fabricated on the transparent windows of cars, airplanes and other facilities as the "head-up displays". Transparent QD-LED panels can be integrated with house windows as innovative light systems, acting as normal windows during the daytime but transitioning to light sources after sunset. Transparent laptop and other such devices can be developed using these transparent QD-LEDs. The QD-LED employs the electrode with an dielectric/metal/dielectric (DMD) structure having an inner dielectric layer that serves the function of the charge transport and injection layer, whereas a thin metal layer, with typical thickness of 5 to 25 nm, functions as the cathode (or anode). The outer dielectric layer covering the thin metal layer reduces reflectance, to permit a high light out-coupling for higher transmittance. The transparent QD-LEDs, according to an embodiment of the invention, are readily fabricated through a series of facile vacuum and solution-based processing steps. Moreover, the level of transmittance and transmitted wavelength can be easily tuned by varying the structure and composition of the dielectric/metal/dielectric electrode.

In an embodiment of the invention, a transparent high work function electrode, for example, an anode, can be formed on a transparent substrate, which can be glass or a polymer, such as, but not limited to, polycarbonate, polyethylene terephthalate, and polymethylmethacrylate. The anode can be, but is not limited to, doped or undoped oxides, including, but not limited to, indium tin oxide (ITO), indium zinc oxide (IZO), indium copper oxide (ICO), Cd:ZnO, $SnO_2$, $In_2O_3$, $F:SnO_2$, $In:SnO_2$, Ga:ZnO, Al:ZnO, $MoO_3$/Au, or Ag/$MoO_3$. In an embodiment of the invention, a hole injection and transport layer can be deposited on the anode by a fluid based method, such as spin coating, printing, casting and spraying a solution or suspension of the material followed by removal of the suspending vehicle, generally an organic liquid, water or mixture of liquids that can be evaporated or otherwise removed from the material to form the layer. The material deposited can be, but is not limited to, an organic polymer comprising poly(3,4-ethylenedioxythiophene) (PEDOT:PSS), poly-N-vinylcarbazole, polyphenylene-vinylene, poly(paraphenylene), polymethacrylate derivatives, poly(9,9-octylfluorene), poly(spiro-fluorene), TPD, NPB, tris(3-methylphenylphenylamino)triphenylamine (m-MTDATA), poly(9,9'-dioctylfluorene-co-N-(4-butylphenyl)diphenylamine) (TFB), poly[2-methoxy-5-(2'-ethylhexyloxy)-1,4-phenylene vinylene] (MEH-PPV) and poly[2-methoxy-5-(3',7'-dimethyloctyloxy)-1,4-phenylene vinylene] (MDMO-PPV) or any of the above mentioned polymers doped with tetrafluoro-tetracyanoquinodimethane (F4-TCNQ). The thickness of the hole transport layer can be about 10 nm to about 200 nm. In another embodiment of the invention, the hole injection layer can be a layer of nanoparticulate metal oxide (MO-NPs), such as, but not limited to, NiO, $MoO_3$, $Cr_2O_3$, $Bi_2O_3$, or p-type ZnO, a non-oxide equivalent, such as $MoS_2$ or p-type GaN, or any combination thereof. The nanoparticulate hole transport layer can be 10 nm to about 100 nm and can be deposited on the anode by a fluid based method, such as spin coating, printing, casting and spraying of a suspension of the nanoparticles on the anode or light-emitting layer and subsequently removing a liquid suspending vehicle, such as an organic liquid, water, or a combination of liquids, by evaporation or other means to form the nanoparticulate layer.

In an embodiment of the invention, QD light emitting layer comprises QDs, for example: Group II-VI compound semiconductor nanocrystals, such as CdS, CdSe, CdTe, ZnS, ZnSe, ZnTe, HgS, HgSe, HgTe or any combination thereof; Group III-V or IV-VI compound semiconductor nanocrystals, such as GaP, GaAs, GaSb, InP, InAs and InSb; PbS, PbSe, PbTe or any combination thereof; $CuInS_2$; $CuInSe_2$ nanocrystals; metal oxide nanoparticles, such as ZnO, $TiO_2$, or a combination thereof; or core-shell structured nanocrystals, such as CdSe/ZnSe, CdSe/ZnS, CdSe/CdS, CdS/ZnSe, CdS/ZnS, ZnSe/ZnS, InP/ZnS, $CuInS_2$/ZnS, $CuInSe_2$/ZnS, ZnO/MgO, or any combination thereof. The semiconductor nanoparticle may be undoped or doped with rare earth elements, such as Eu, Er, Tb, Tm, Dy or any combination thereof, or doped with transition metal elements, such as Mn, Cu, Ag or any combination thereof. The quantum dot light-emitting layer can have a thickness of about 5 nm to about 25 nm, and can be deposited, for example, on the hole transport layer by a fluid based method, such as spin coating, printing, casting and spraying of a suspension of the QDs, and removing a liquid suspending vehicle to form the QD light-emitting layer.

The cathode can be the DMD electrode, where the DMD electrode comprises a first dielectric layer, a thin metal layer, a film, and a second dielectric layer, a second film or second nanoparticle layer, where the first dielectric layer is directed toward the light emitting layer. The first dielectric layer comprises inorganic nanoparticles or polymer-inorganic nanoparticle blends of about 10 to about 40 nm in thickness and the second dielectric layer is about 30 to about 200 nm in thickness and can be nanoparticulate or a continuous film. The second dielectric layer promotes the emission of light from the device. The metal layer is sufficiently thin to be semitransparent. In general, the metal layer is at least 5 nm in thickness such that a continuous metal film of low sheet resistance, less than 40 Ω/square, is achieved and is sufficiently thin to be transparent, being no more than about 30 nm in thickness, for example, a metal film of 5 to 25 nm to provide very low sheet resistance and transmittance above about 40% over the visible spectrum. The first dielectric layer can be ZnO, $TiO_2$, $Cs_2O$, $MoO_3$, $WO_3$, $V_2O_5$, $Cr_2O_3$ or NiO nanoparticles, either undoped or doped with Al, Cd, Cs, Cu, Ga, Gd, Ge, In, Li and/or Mg, or polymer-nanoparticle blends. The metal layer can be Ag, Au, Al, Ca, Mg, Cu, Mo or Mg:Ag alloy. The second dielectric layer can be ZnSe, ZnS, $Al_2O_3$, ZnO, WO3, $TiO_2$, $MoO_3$, $SiO_2$ or $SiN_x$, and can be nanoparticulate, continuous or polymer-nanoparticle blends.

Figure 2:
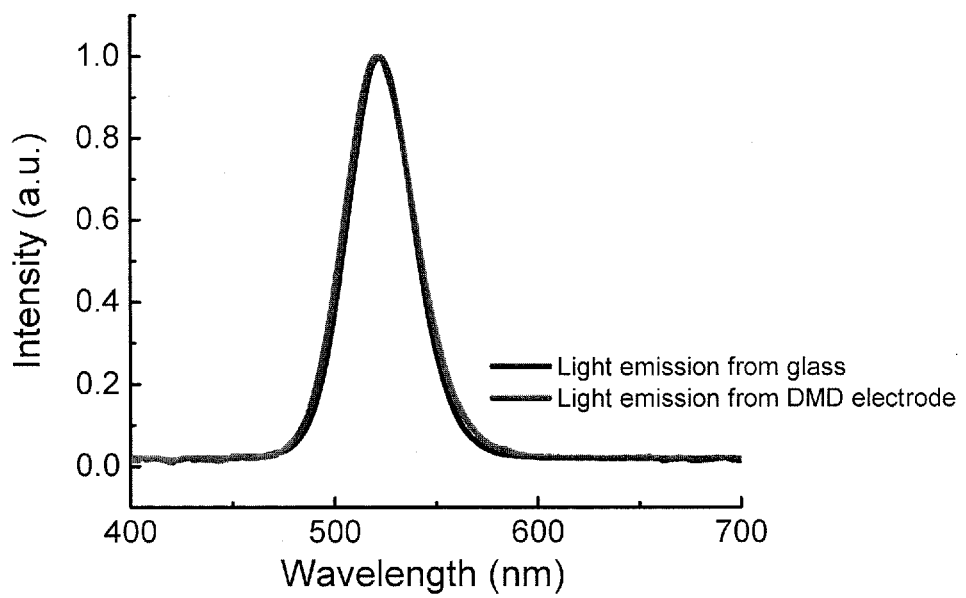
FIG. 2 shows electroluminescence (EL) spectra of transparent QD-LEDs where plots of the light emission from the glass and DMD electrode sides of a device of the type shown in FIG. 1, according to an embodiment of the invention, are superimposed.
Figure 3:
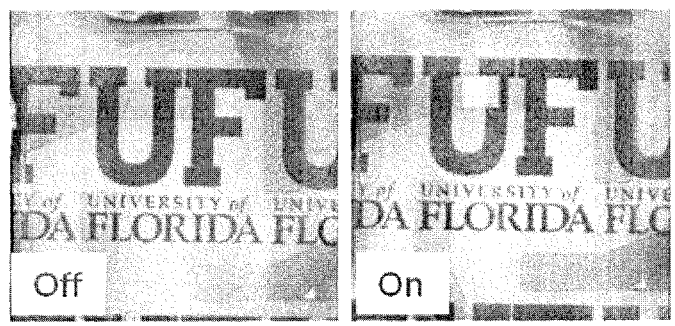
FIG. 3 shows photographs of a green emitting transparent QD-LED with a ZnO NP (35 nm)/Ag film (15 nm)/MoO$_3$ film (40 nm) DMD electrode, according to an embodiment of the invention, in the off state (left) and the on state (right).

FIG. 1 shows an exemplary transparent QD-LED structure using a dielectric/metal/dielectric (DMD) electrode, according to an embodiment of the invention. In FIG. 1, the transparent DMD electrode comprises ZnO nanoparticles having the structure ZnO NPs/Ag film/ZnO NPs or ZnO NPs/Ag film/$MoO_3$ film, which is illustrated in FIG. 1 as a continuous film. ZnO NP layers are advantageous in that the layers can be deposited using a solution process, such as, spin-coating or inkjet printing. The thin metal layer and the thin $MoO_3$ or ZnO layer can be deposited using a vacuum thermal evaporation process. As shown in FIG. 1, the transparent high work function electrode comprises poly[(9,9-dioctylfluorenyl-2,7-diyl)-co-(4,4-(N-(4-sec-butylphenyl))diphenylamine)] (TFB) on poly(3,4-ethylenedioxythiophene): polystyrene sulfonic acid (PEDOT:PSS), which can be substituted with polythienothiophene (PTT) doped with poly(perfluoroethylene-perfluoroethersulfonic acid) (PFFSA), on indium-tin-oxide (ITO). As both electrodes are transparent, the CdSe—CdS core-shell QDs of the light emitting layer give nearly identical electroluminescence (EL) spectra from both faces of the transparent QD-LED, as shown in FIG. 2. As can be seen in the photographs of FIG. 3, the QD-LED is nearly undetectable when off and readily seen upon application of a current.

Figure 4:
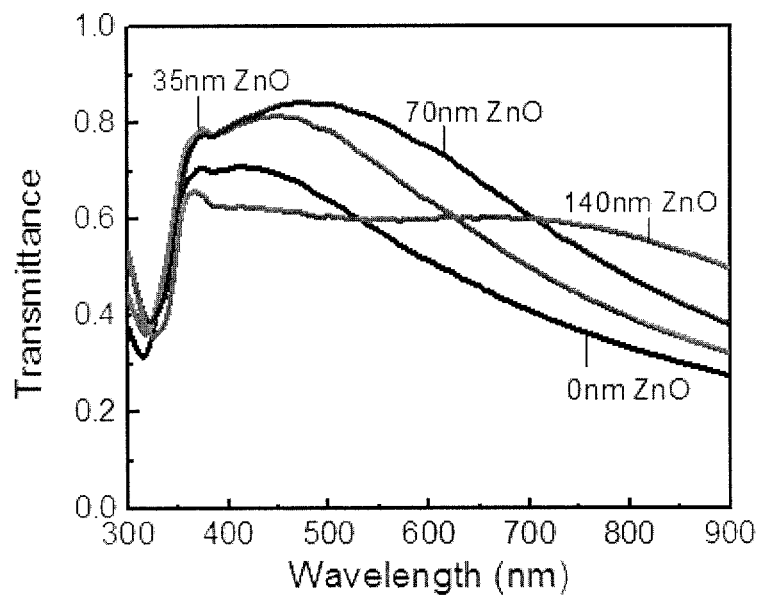
FIG. 4 shows transmittance spectra of transparent dielectric/metal/dielectric (DMD) electrodes employed with transparent QD-LEDs, according to an embodiment of the invention, having a DMD of ZnO NP (35 nm)/Ag film (15 nm)/ZnO NP (x nm), where x=0, 35, 70, and 140 nm.

FIG. 4 shows the transmittance of a DMD electrode with a structure of Zn NPs (35 nm)/Ag (15 nm)/ZnO NPs (variable thickness x in nm) as a function of the variable face ZnO NP layer thickness x is varied. Transmittance at 500 nm is only 63% when the electrode lacks the variable ZnO NP layer (x=0 nm), whereas, when the electrode includes a ZnO NP layer of 35 and 70 nm, an increased 500 nm light transmittance of 78% nm and 84%, respectively, is observed with an increased transmittance above 550 nm, relative to the electrode that lacks the layer. Although a thicker outer capping ZnO NP layer, where x=140 nm, displays a lower transmittance at 500 nm, an increase in transmittance is observed above 550 nm that extends into the near IR relative to no outer ZnO NP layer, with the transmittance in the near IR increasing with the thickness of the ZnO NP layer.

Figure 5:
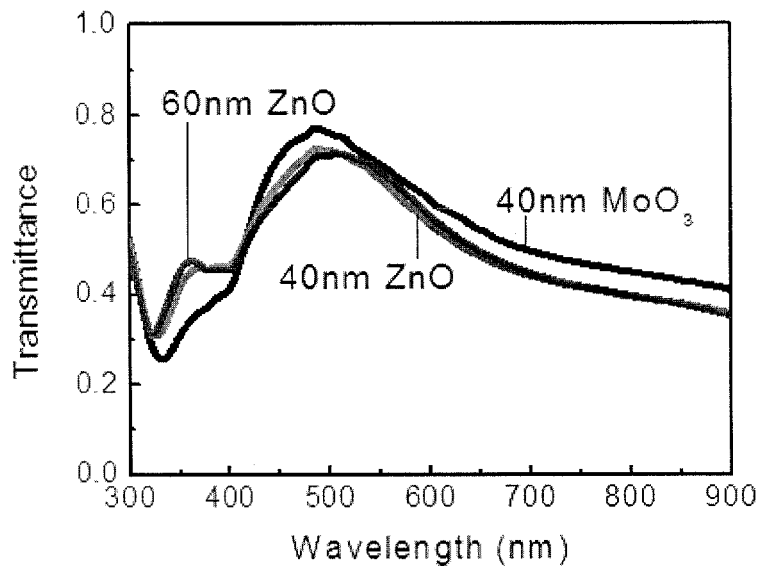
FIG. 5 shows transmittance spectra from green emitting transparent QD-LEDs, according to an embodiment of the invention, having DMD electrodes of ZnO NPs: (35 nm)/Ag film (15 nm)/ZnO NP (40 nm); ZnO NP (35 nm)/Ag film (15 nm)/ZnO film (60 nm), and ZnO NP (35 nm)/Ag film (15 nm)/MoO$_3$ film (40 nm).
Figure 6:
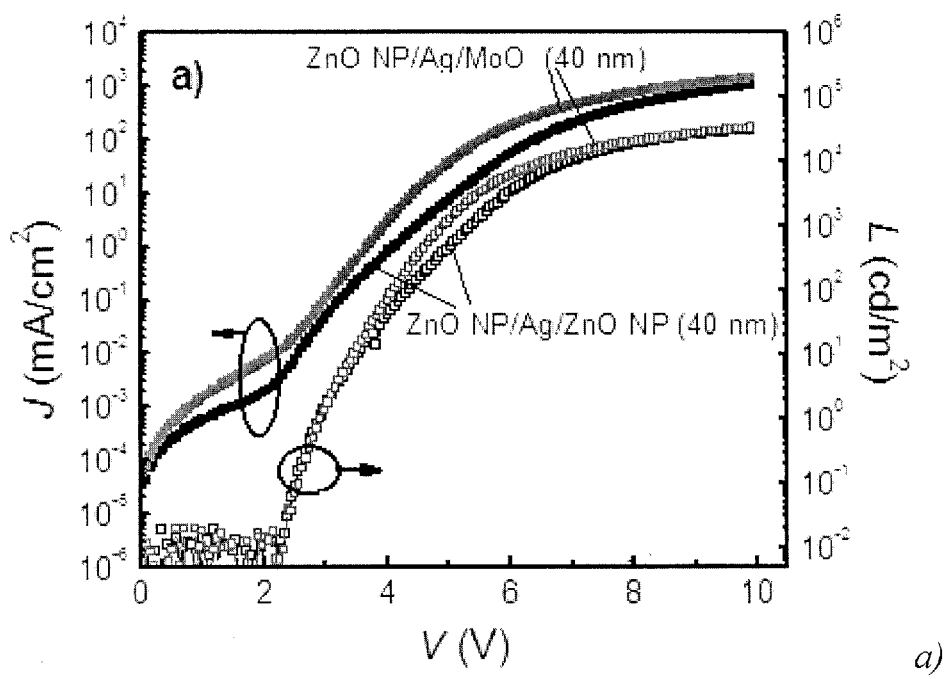
FIG. 6 shows: a) J-L-V plots for green emission transparent QD-LEDs, according to an embodiment of the invention, having DMD electrodes of ZnO NP (35 nm)/Ag film (15 nm)/ZnO NP (40 nm) and ZnO NP (35 nm)/Ag film (15 nm)/MoO$_3$ film (40 nm); and b) plots of the current and external quantum efficiency as a function of luminance of the ZnO NP (35 nm)/Ag film (15 nm)/ZnO NP (40 nm) and ZnO NP (35 nm)/Ag film (15 nm)/MoO$_3$ film (40 nm) devices.
Figure 6:
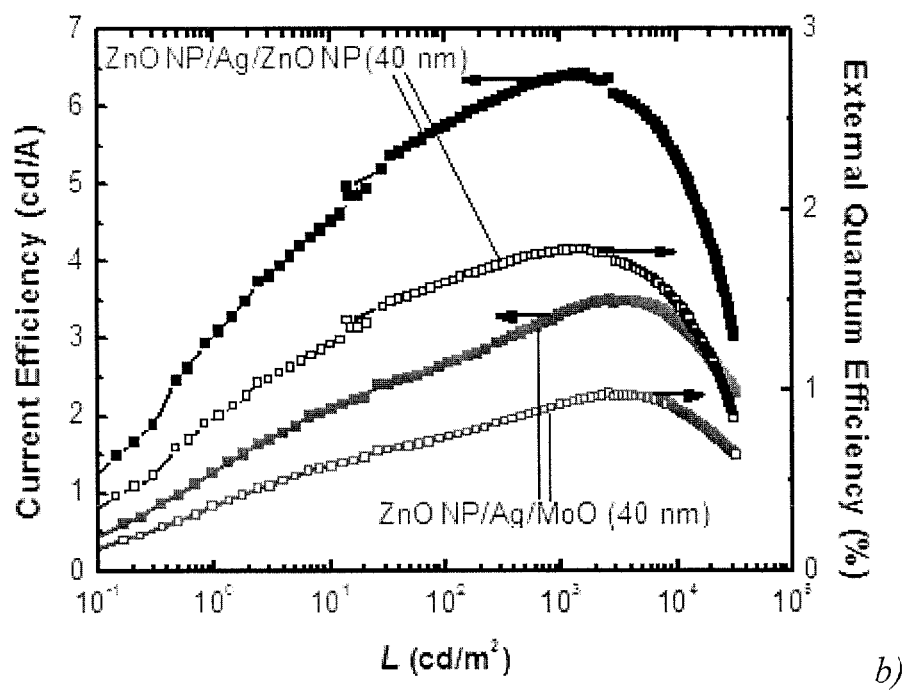

FIG. 5 shows the transmittance of a DMD employed in a QD-LED, according to an embodiment of the invention, with transmittance as high as 80% at 500 nm with DMD electrode of ZnO NP (35 nm)/Ag (15 nm)/MoO$_3$ (40 nm), and slightly lower transmittance for devices where the electrode consists of ZnO NP (35 nm)/Ag (15 nm)/ZnO NP (40 or 60 nm). The current density-luminance-voltage (J-L-V) characteristics and external quantum efficiencies of two transparent QD-LEDs are shown in FIG. 6. The transparent QD-LEDs consist of DMD electrode of ZnO NP (35 nm)/Ag film (15 nm)/ZnO NP (40 nm) or ZnO NP (35 nm)/Ag film (15 nm)/MoO$_3$ film (40 nm). Both transparent QD-LEDs display good charge injection with the DMD electrode having a maximum luminance of 32,000 cd/m$^2$. The peak current and external quantum efficiency reach 6.4 cd/A and 1.8% with 40 nm ZnO NP and 3.5 cd/A and 1.0% with a 40 nm MoO$_3$ film.

Figure 7:
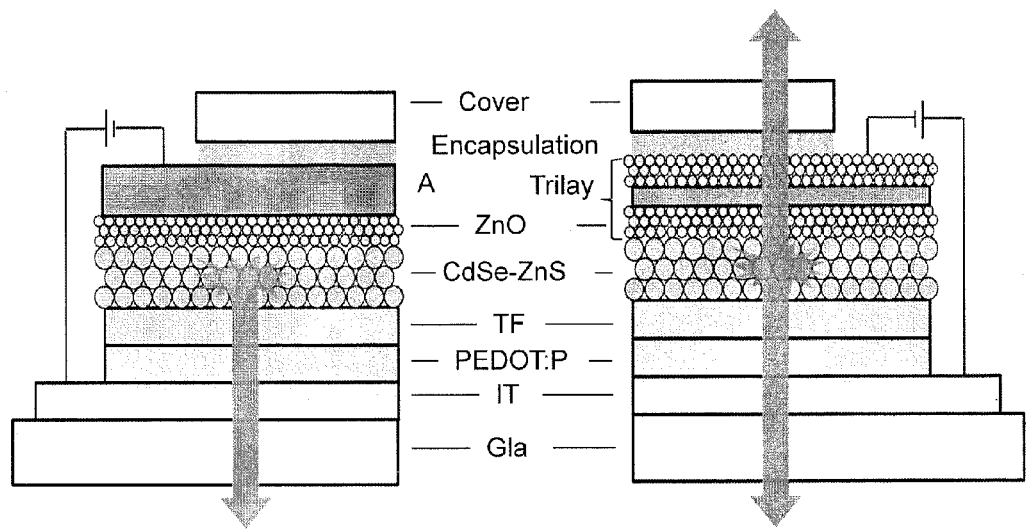
FIG. 7 shows a representation of the layered structure of a conventional bottom-emitting QD-LED and a transparent QD-LED, according to an embodiment of the invention.

A transparent QD-LED employing a ZnO NP/Ag film/ZnO NP transparent cathode having a similar architecture as that of FIG. 1, which shows an outer MoO$_3$ film, and, for comparison purposes, a conventional bottom-emitting QD-LED with a top metal cathode are shown in FIG. 7. A conventional bottom-emitting QD-LED was constructed with a 100 nm thick Al top reflective cathode with a ZnO layer to serve as an electron transport layer as was a transparent QD-LED that was of equivalent construction but a top cathode where a thin layer of Ag or Au (15 nm) with a 50 nm thick ZnO nanoparticles layer distal to the QD light emitting layer and a second ZnO layer nanoparticle layer proximal to the QD light emitting layer.

Figure 8:
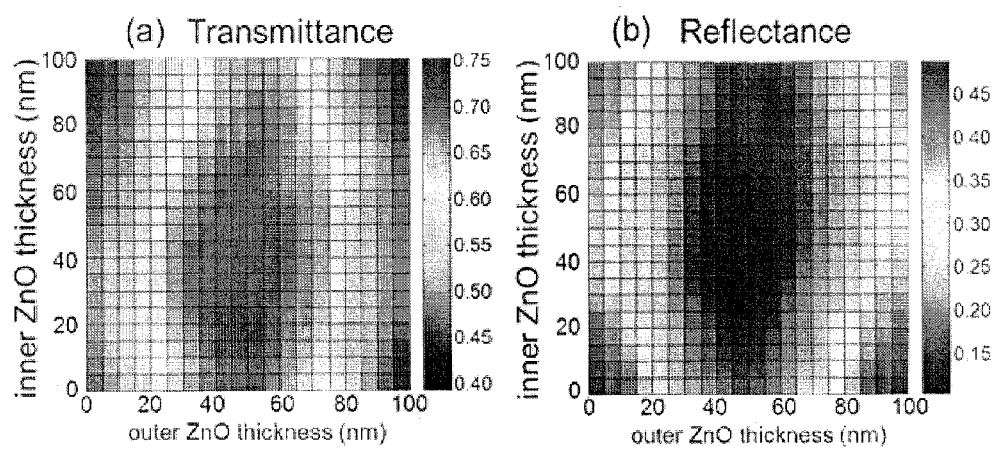
FIG. 8 shows simulated transmittance a) and reflectance b) of Ag DMD electrodes at) $\lambda$=530 nm with varying inner and outer ZnO NP layer thicknesses, for transparent QD-LEDs, according to an embodiment of the invention.

The two oxide layers play an important role in determining the optical transmittance of the multi-layer stack. To aid in the selection of the layer parameters, simulated transmittance and reflectance of the ZnO/metal/ZnO electrodes on glass substrates with varying the inner and outer ZnO layer thicknesses was performed using the optical simulation software (Lumerical Solutions, Inc) based on a Finite Difference Time Domain (FDTD) algorithm. Transmittance of the structure is calculated as the light intensity ratio between the transmitted light and incident light, whereas reflectance is the ratio between the reflected light and incident light. FIGS. 8(a) and 8(b) show maps of calculated transmittance and reflectance for ZnO/Ag/ZnO structures with a 15 nm thick Ag layer for varying inner and outer ZnO thicknesses at λ=530 nm. Only minor difference in transmittance and reflectance is observed for the DMD structure upon varying the inner ZnO layer thickness, whereas the thickness of the outer ZnO capping layer strongly affects the optical parameters. For example, with a fixed inner ZnO layer thickness of 40 nm, transmittance of the Ag DMD electrode increases from 55% when the outer ZnO thickness is 10 nm to about 75% with the outer ZnO thickness of 50 nm but then decreases to 55% when the outer ZnO thickness increases to 90 nm. This trend is primarily due to the index contrast between the oxide layer and its corresponding environment. The index contract between the outer ZnO layer (n≈2.0) and air (n≈1.0) is much larger than that of the inner ZnO layer (n≈2.0) and glass substrate (n≈1.5), resulting in a significant optical field redistribution at the outer ZnO/air interface. The simulated maximum transmittance value (T>0.7) is achieved when setting the inner ZnO layer thickness within the range of 20 to 60 nm and the outer ZnO layer in the range of 40 to 60 nm.

Figure 9:
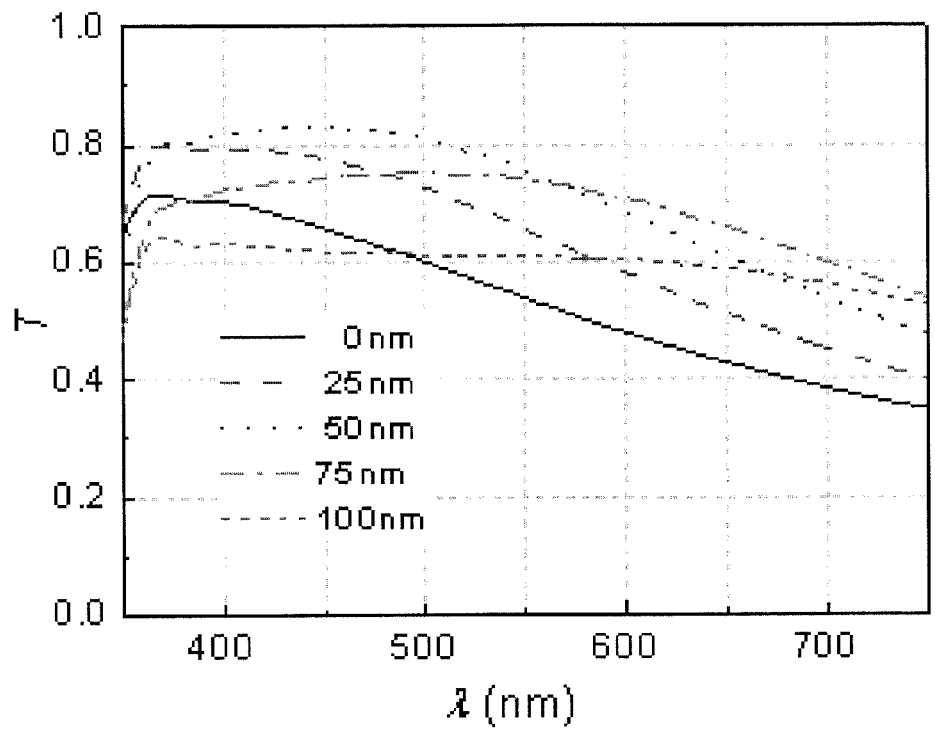
FIG. 9 shows a composite plot of measured transmittance of ZnO/Ag/ZnO DMDs with fixed inner ZnO NP thickness of 25 nm and various outer ZnO NP thicknesses, for transparent QD-LEDs, according to an embodiment of the invention.

FIG. 9 compares the experimental transmittance (T) spectra of ZnO/Ag/ZnO DMD electrodes on glass substrates for electrodes having a fixed inner ZnO layer of 25 nm and an intermediate Ag layer of 15 nm but with different outer capping layer thicknesses. At λ=530 nm, the DMD transmittance increases from ~60% to above 80% and then decreases to ~60% when the thickness of the outer oxide capping layer increases from 0 nm to 50 nm and to 100 mm. If not otherwise indicated, subsequent disclosure to devices are those with ZnO/Ag/ZnO DMD electrodes having an inner ZnO layer of 25 nm thickness, an Ag layer of 15 nm thickness and an outer layer of 50 nm thickness.

Figure 10:
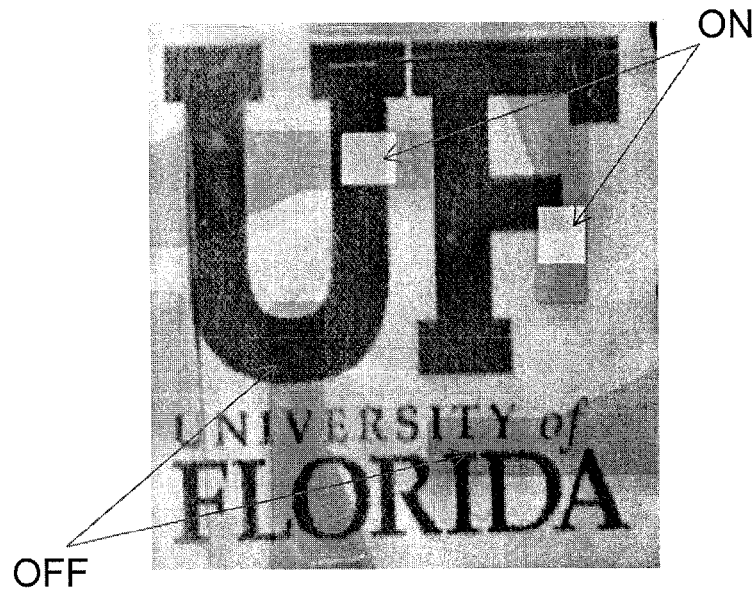
FIG. 10 shows a photograph of transparent QD-LED devices with ON and OFF pixels for a transparent QD-LED with a ZnO/Ag/ZnO DMD electrode, according to an embodiment of the invention.
Figure 11:
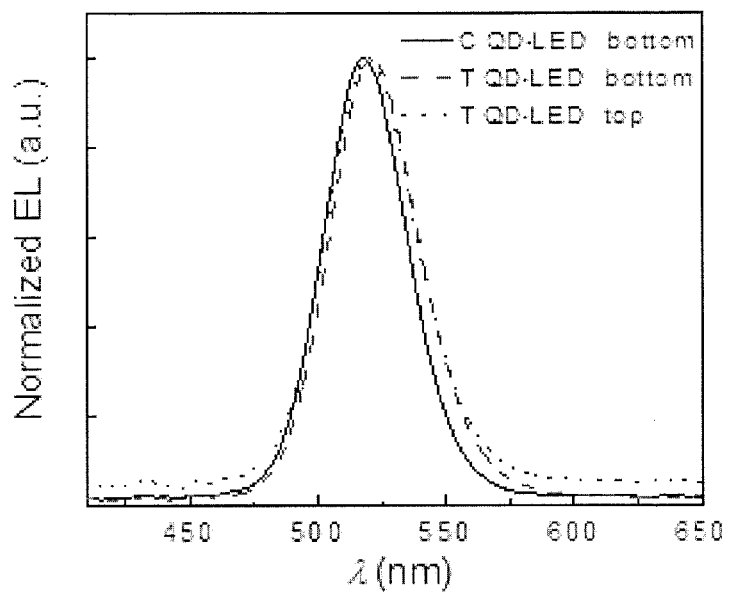
FIG. 11 shows EL spectra of a green conventional QD-LED and a transparent QD-LED from the ITO and DMD electrode faces, according to an embodiment of the invention.
Figure 12:
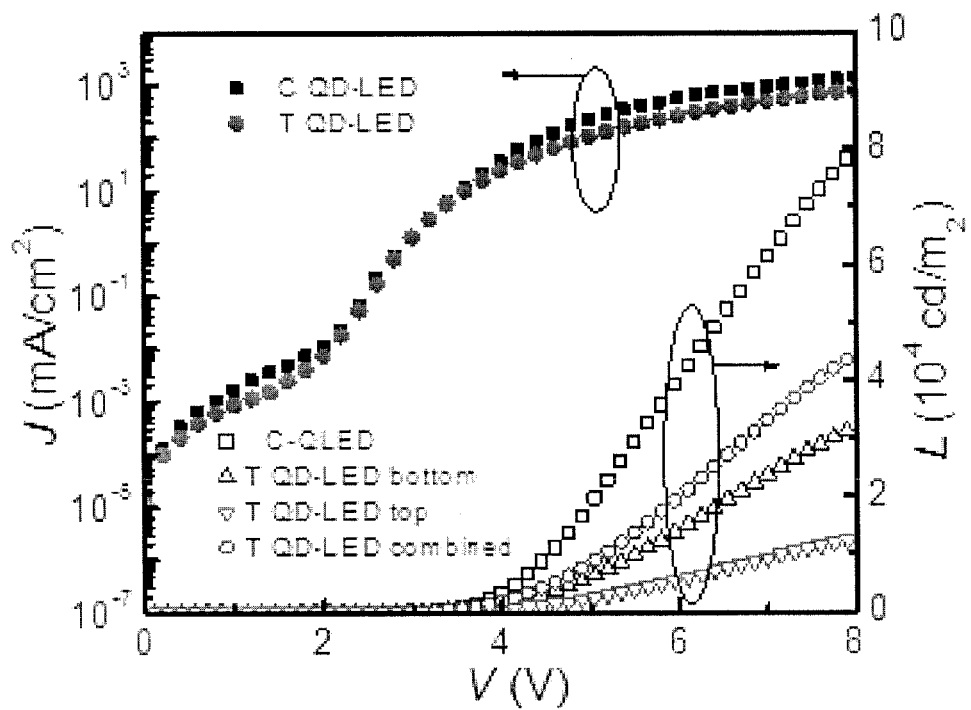
FIG. 12 shows a) J-L-V plots for a green conventional QD-LED and a transparent QD-LED with a ZnO/Ag/ZnO DMD electrode, according to an embodiment of the invention.
Figure 13:
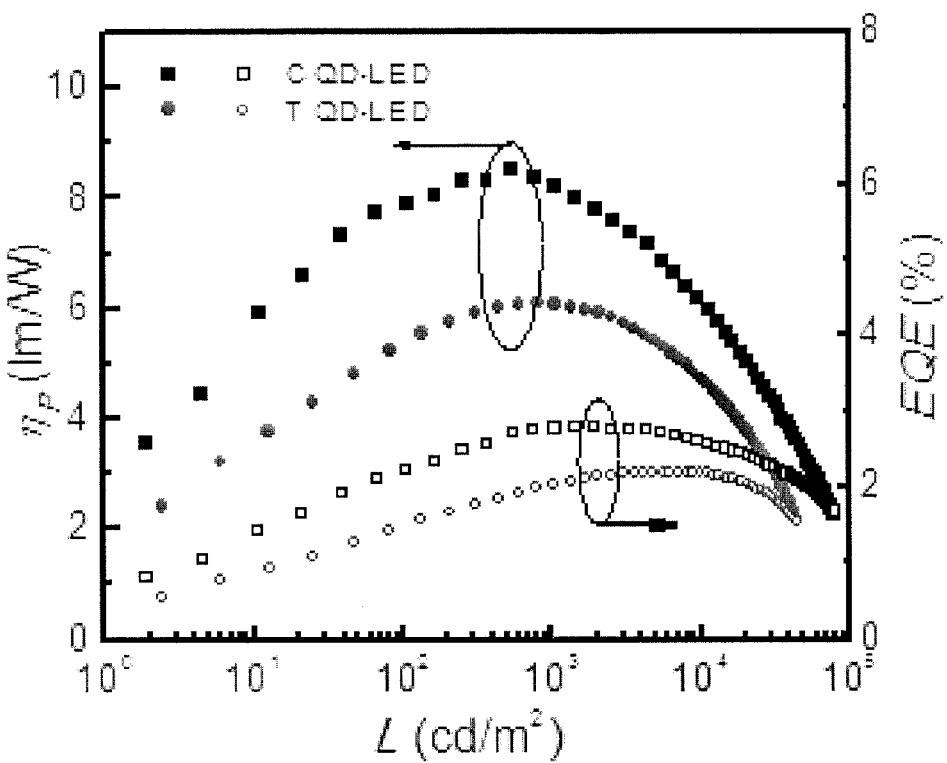
FIG. 13 shows plots for power and external quantum efficiencies as a function of luminance for a green conventional QD-LED and a transparent QD-LED with a ZnO/Ag/ZnO DMD electrode, according to an embodiment of the invention.

As shown photographically in FIG. 10 showing ON and OFF pixels, transparent devices were fabricated with transparent green QD-LEDs with the ZnO (30 nm)/Ag (15 nm)/ZnO (50 nm) DMD top electrodes. FIG. 11 shows electroluminescence spectra of the conventional QD-LED and the transparent QD-LED. As can be seen in FIG. 11, the DMD electrode does not affect the color emitted by: the transparent QD-LED and displays the same peak emission wavelength from the bottom ITO anode and the top (DMD) cathode at λ=520 nm, which is nearly identical to the peak light emission of the conventional QD-LED. FIG. 12 shows plots of the current density-luminance-voltage (L-J-V) characteristics of the conventional QD-LED and the transparent QD-LED. Both the conventional QD-LED and the transparent QD-LED devices display an identical turn-on voltage of $V_T$=2.2 eV. However, the transparent QD-LED shows a lower current density than that of the conventional QD-LED at a given driving voltage. For example, J of the conventional QD-LED is about 550 mA/cm$^2$ at V=6.0 V, whereas J≈260 mA/cm$^2$ for the transparent QD-LED at that voltage. The lower device current for the transparent QD-LED can be attributed in part to the relatively low sheet resistance of the DMD electrode compared to the conventional QD-LED's Al electrode. In a transparent QD-LED, photons escape from the two transparent electrodes when the device is on. The luminance of the emitting light from both the bottom ITO ($L_{bottom}$) and top ($L_{top}$) electrodes was measured and plotted; as shown in FIG. 12, the maximum luminance of $L_{bottom}$=32,000 cd/m$^2$ and $L_{top}$=13,000 cd/m$^2$ are obtained at V=8.0 V. For a fair comparison to the conventional device, the two luminous fluxes from both faces of the transparent QD-LED are summed as the total light emission of the transparent QD-LED. At V=8.0 V, the transparent QD-LED showed a maximum luminance of L=45,000 cd/m$^2$, which is about one half of that of the conventional QD-LED (L=80,000 cd/m$^2$ at V=8.0 V). Therefore, even with the compensation of the device current density, the transparent QD-LED shows a lower power efficiency ($\eta_P$, maximum $\eta_P$=4.5 lm/W) and external quantum efficiency ($\eta_{EQE}$, maximum $\eta_{EQE}$=2.3%), than does the most equivalent conventional QD-LED, which has a maximum $\eta_P$ of 6.2 lm/W and maximum $\eta_{EQE}$ of 2.8%, as shown in FIG. 13.

The ZnO/Ag/ZnO DMD electrode shows high transmittance (T>75%) in the range of λ=400 nm to 530 nm, which is suitable for devices with green light emission (λ≈520 nm). Transmittance of the Ag-based DMD electrode decreases beyond λ=550 nm, which is ~65% at λ=630 nm and limits the performance of devices employing the ZnO/Ag/ZnO DMD electrode for red light emission (λ≈630 nm).

Figure 14:
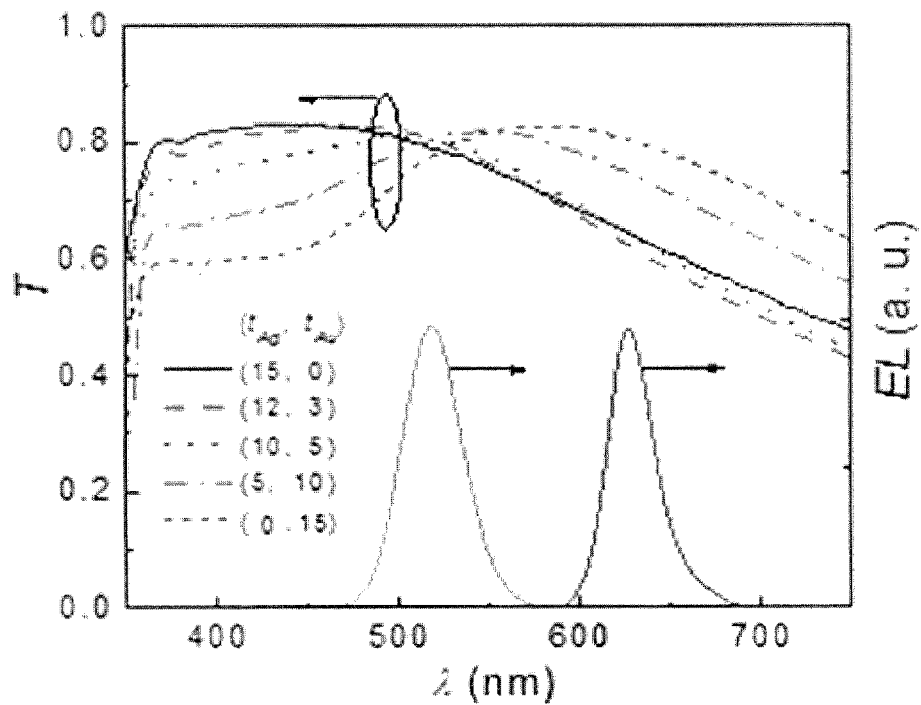
FIG. 14 shows electroluminescent spectra for green and red transparent QD-LEDs and green transmittance spectra of ZnO/Ag/ZnO or ZnO/Au/ZnO DMD electrodes on glass substrates for various intermediate Ag and Au thickness with total metal thickness of 15 nm for transparent QD-LED with a ZnO/Ag and/or Au/ZnO DMD electrode, according to an embodiment of the invention

The transmittance of DMD electrode in long wavelength region is dependent on the intermediate metal layers. By incorporating Au into the intermediate Ag layer of the structure, the optical transmittance in red region is improved. FIG. 14 shows transmittance spectra for ZnO/metal/ZnO DMDs with different combinations of intermediate metal layers. With increasing Au component in the metal layer, the maximum transmittance remains at about the same level, but the peak emission shifts from 450 nm to 600 nm. At the wavelength of the light emission for a red devices (λ=625 nm), the DMD electrode having a pure Au layer (15 nm) displays a transmittance of T=80%, which is advantageous as a transparent electrode for devices with red emission.

Figure 15:
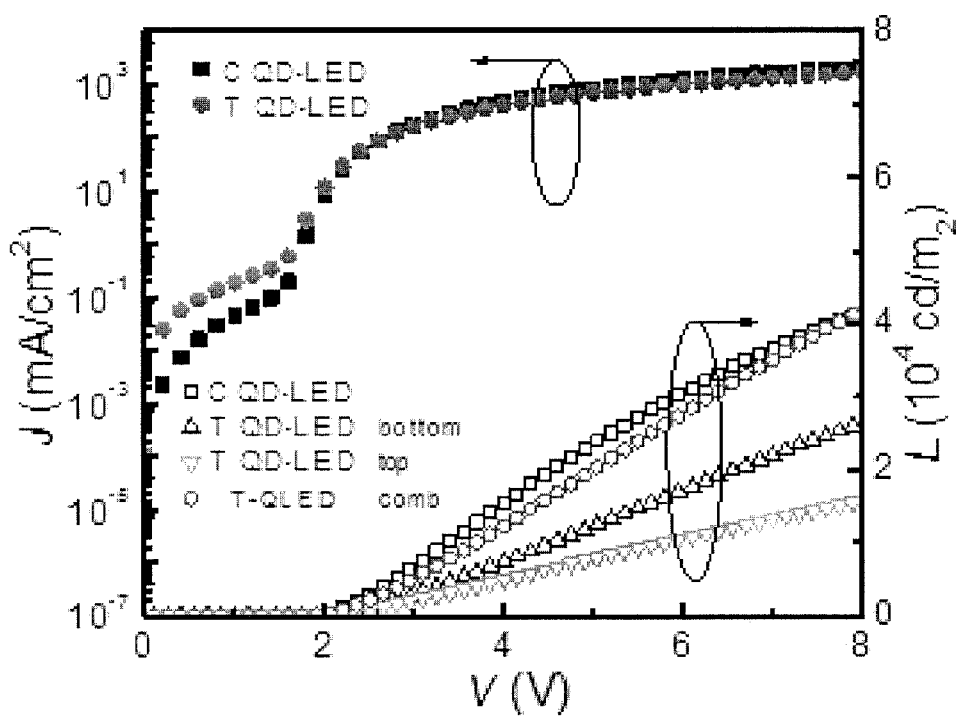
FIG. 15 shows J-L-V plots for a red conventional QD-LED and a red transparent QD-LED with a ZnO/Ag/ZnO DMD electrode, according to an embodiment of the invention.
Figure 16:
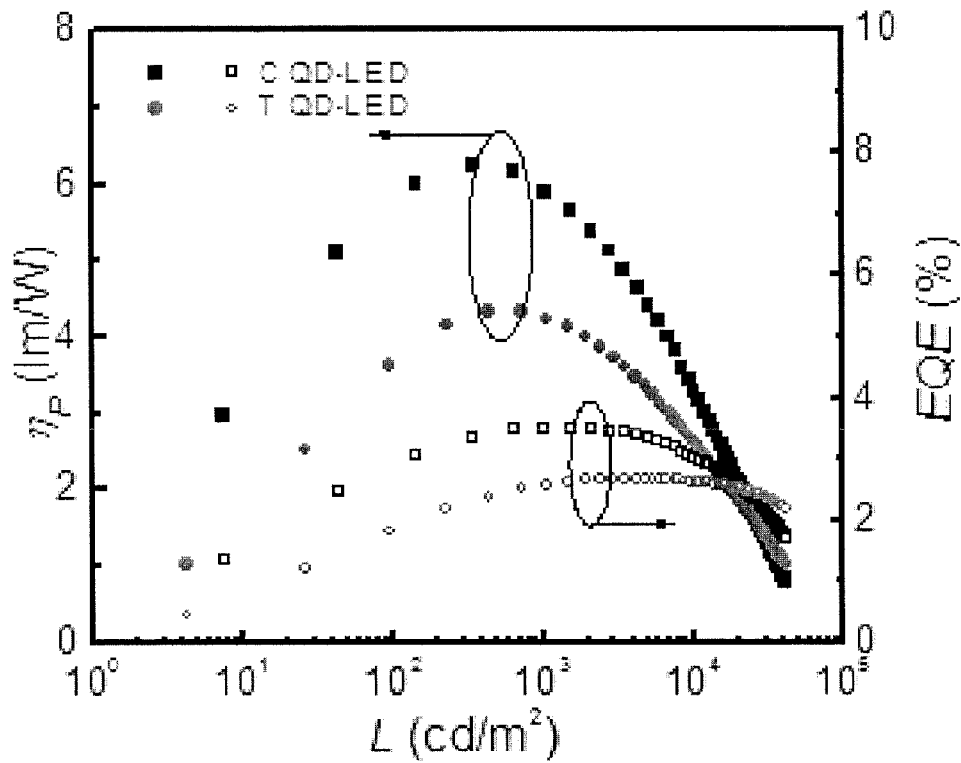
FIG. 16 shows plots for power and external quantum efficiencies as a function of luminance for a red conventional QD-LED and a red transparent QD-LED with a ZnO/Ag/ZnO DMD electrode, according to an embodiment of the invention.

A red transparent QD-LED containing an Au-based electrode was successfully demonstrated. FIG. 15 shows the L-J-V characteristics of the transparent QD-LED and a conventional device as a comparison. The transparent and bottom-emitting devices show similar turn-on voltages of $V_T$=1.7 V where the transparent QD-LED has a slightly lower device current than that of the conventional QD-LED. However, the total luminance of the transparent QD-LED is lower than that of the conventional QD-LED (L=20,000 vs 24,000 cd/m² at V=5.0 V), resulting in a lower maximum external quantum efficiency of $\eta_{EQE}$ 2.7%, compared to $\eta_{EQE}$=3.5% for the conventional QD-LED, as illustrated in FIG. 16.

Figure 17:
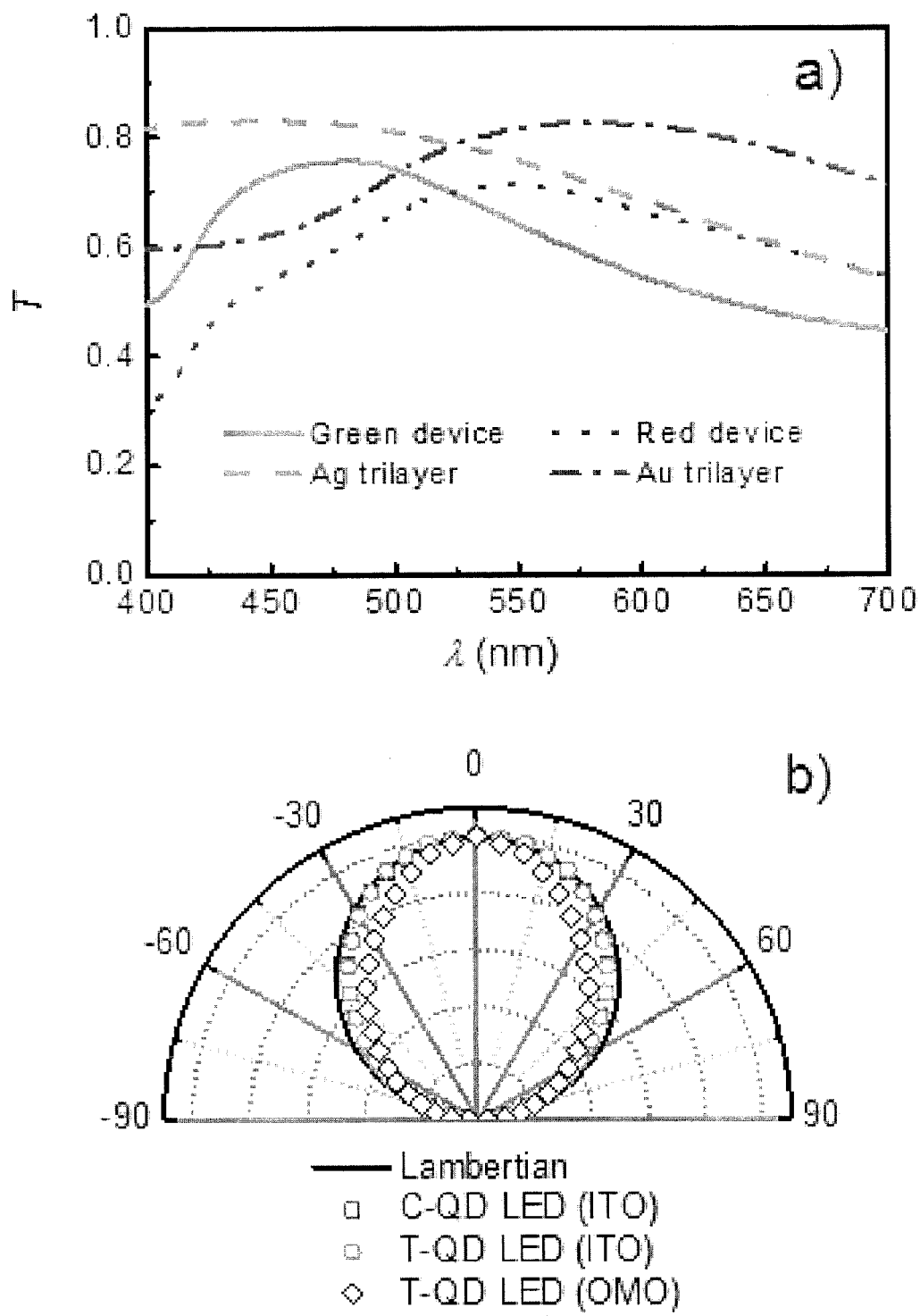
FIG. 17 shows a) transmittance spectra of the green and red transparent QD-LED, according to an embodiment of the invention, with ZnO/Ag/ZnO and ZnO/Au/ZnO DMD electrodes, respectively and b) plots of the normalized luminous intensity as a function of the viewing angle from the ITO and DMD electrodes for the conventional QD-LED, transparent QD-LED, and a Lambertian source.

Optical transparency of the transparent light emitting devices is high. The transmittance (T) spectra of a green transparent QD-LED with an Ag DMD and a red transparent QD-LED with Au DMD are shown in FIG. 17(a). The green transparent QD-LED has a peak transmittance of about 80% at λ=470 nm, whereas the red transparent QD-LED has a peak transmittance at about 550 nm, which are primarily dependent on the transmittance of the DMD structure. The transmittance of these transparent QD-LED is superior to most known transparent LEDs. FIG. 17(b) shows composite plots of the angular emission patterns of light emitted from the ITO electrodes of the conventional QD-LED and transparent QD-LED and the light emitted from the DMD electrode of the transparent QD-LED with a comparative plot of that from a Lambertian source. Emissions of light from the ITO face of the conventional QD-LED and transparent QD-LED have similar angular profile that is slightly narrower than emission from a Lambertian source. The emissive light from the DMD electrode of the transparent QD-LED shows a negligible pattern change, only slightly narrower, than that from the ITO electrodes. This can be attributed to the interference in the multiple thin layers stacking and more photons are trapped within the DMD structure at large angles, compared to that from the ITO side.

Figure 18:
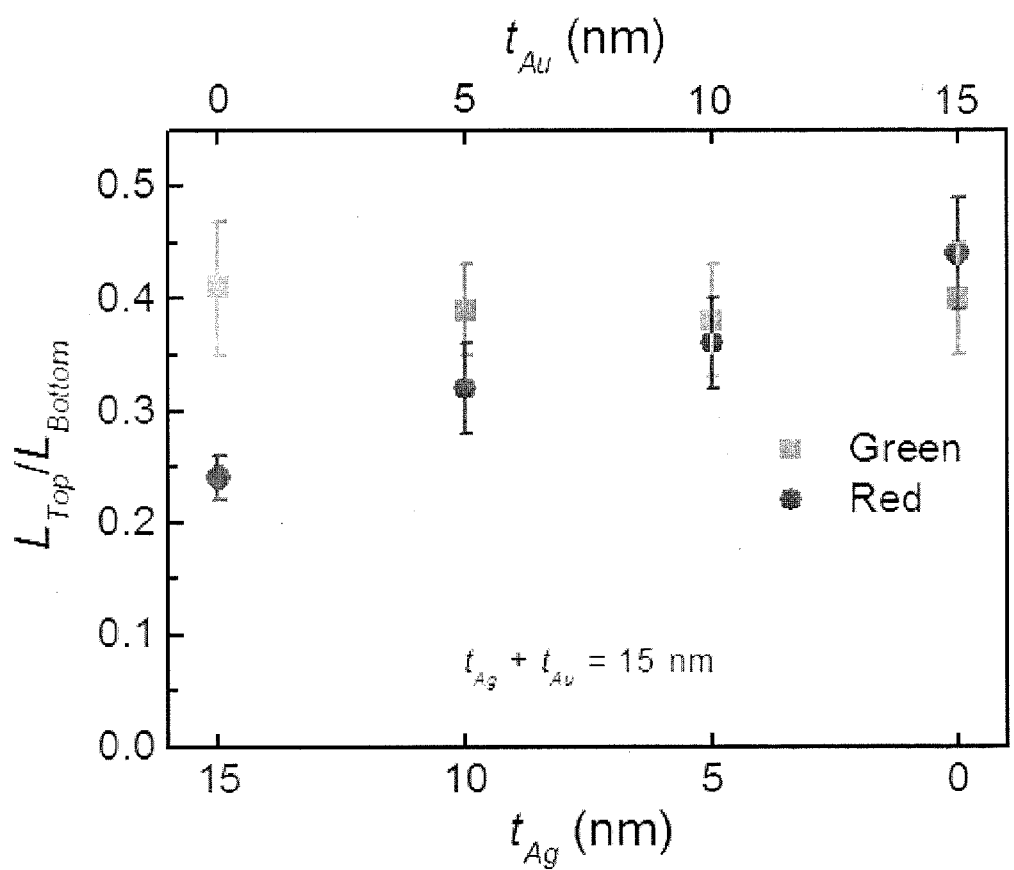
FIG. 18 shows a plot of luminance ratios of the top DMD electrode and the bottom ITO electrode for green and red transparent QD-LED with a ZnO/Ag/ZnO DMD electrodes, according to an embodiment of the invention as a function of metal thickness in the DMD electrodes.

FIG. 18 shows a plot of the ratio of luminous fluxes of the top DMD and bottom ITO electrodes, $L_{top}/L_{bottom}$, for both green and red transparent QD-LEDs as a function of the intermediate Ag thickness, $t_{Ag}$, of an Au/Ag layer in DMD electrodes having a total metal thickness of 15 nm. The changes of the top and bottom luminance ratio for the green devices are minimal, $L_{top}/L_{bottom}$≈40%, with varying in the Ag thickness in the metal layer of the DMD electrode. This is consistent with the transparency of the DMD electrode at λ=530 nm, where the transmittance maintains in the same level for the DMD electrodes with different intermediate metal components, as shown in FIG. 14. However, the luminance ratio of the red TRANSPARENT QD-LEDs increases from 25% to up to 45% with increasing Au content in the DMD electrodes, majorly due to the variation of DMD electrode transmittance at λ=630 nm.

As shown in FIG. 14, the Ag and Au DMD have the maximum transmittance of ~80% at λ=530 nm (green QD-LEDs) and λ=630 nm (red QD-LEDs), respectively, which is about 10% lower than that of the ITO electrodes. Although, the transparency difference of the two electrodes of the transparent QD-LED electrodes is only about 10% the experimental luminance ratio, $L_{top}/L_{bottom}$, is in the range of 40% to 50%. This discrepancy may be due to a strong micro-cavity effect within the device in the direction towards the ITO electrode. In this manner, although the oxide capping layer helps improve the transparency of the DMD electrode relative to a bare metal surface, with about 20% light reflection by the DMD electrode, the luminance ratio would be in the observed range as the reflected light from the DMD electrode is combined with the directly emitted light from the ITO electrode.

Figure 19:
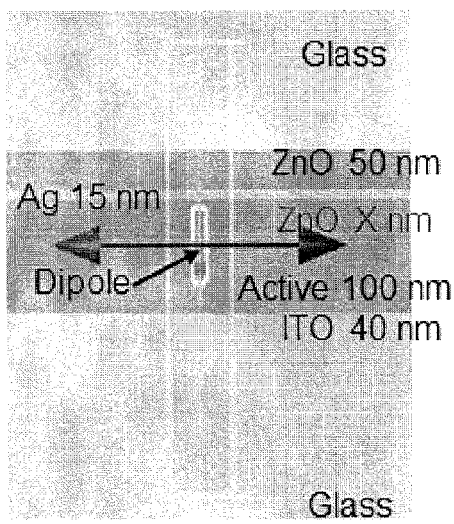
FIG. 19 shows a schematic illustration of device architecture for the simulation of light extraction efficiency for a transparent QD-LED used for FDTD analysis.
Figure 20:
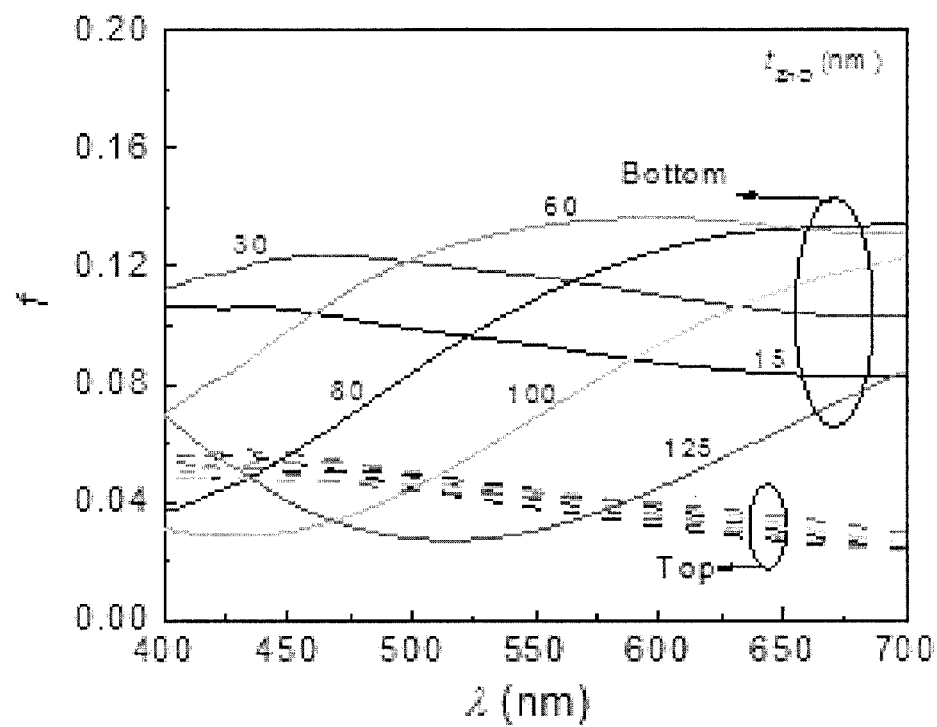
FIG. 20 shows plots of the simulated light extraction efficiency, from both top DMD electrodes and bottom ITO electrodes for transparent QD-LEDs with different inner ZnO thicknesses of the DMD electrode.
Figure 21:
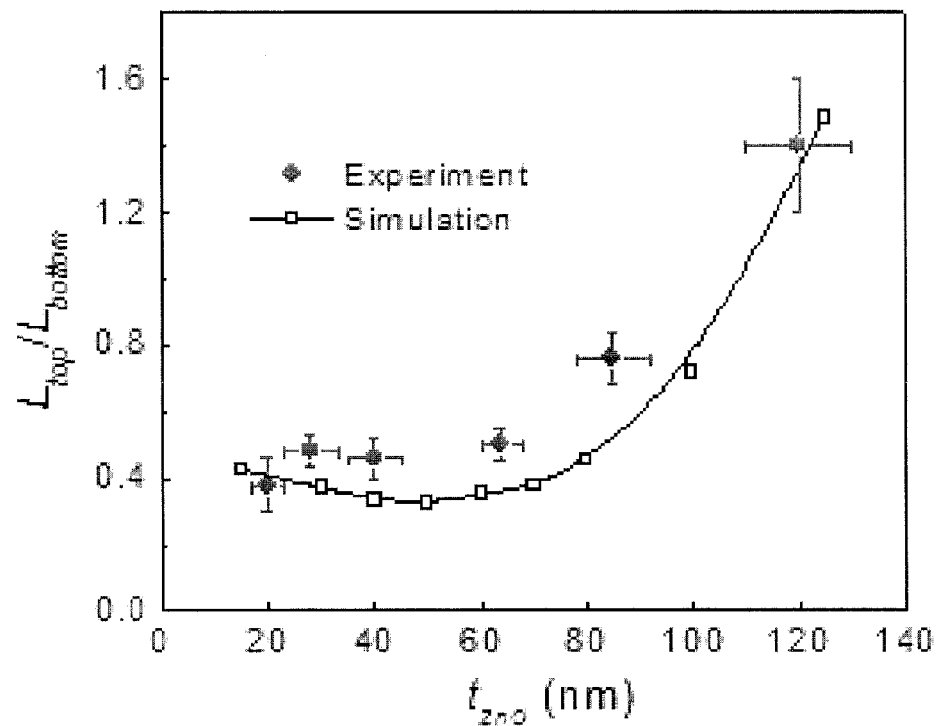
FIG. 21 shows a plot of the luminous flux ratio from the top and bottom electrodes, as a function of the inner ZnO thicknesses ($t_{ZnO}$), for experimentally determined and simulated transparent QD-LEDs, according to an embodiment of the invention.

FDTD software was used to simulate light extraction efficiency from the top and bottom electrodes of the transparent QD-LEDs. The simulation structure is schematically represented in FIG. 19, as having a glass substrate, a 40-nm-thick ITO electrode, a 100-nm-thick organic layer, an inner ZnO layer with various thicknesses, a 15-nm-thick Ag layer, an outer 50-nm-thick ZnO layer and a glass encapsulation layer. Dipoles with x, y, z directions are set 90 nm away from the ITO layer to mimic the light generation in the emissive layer. To simplify the simulation, monitors are set in the glass substrate and encapsulation sides to calculate the power intensity of the emitting light in the glass medium. Therefore, the FDTD simulation neglects the light trapped within the glass substrate and glass encapsulant due to the total internal reflection at the glass/air interface. Because the glass substrate and encapsulant used in the actual transparent QD-LED have thickness in the range of 0.5 mm to 1.0 mm, strong interference within such thick glass layers is negligible and ray-tracing methods are used to calculate trapped photons. By combining the FDTD and ray-tracing calculations, simulation results are produced as are plotted in FIG. 20, where dashed lines represent light extraction efficiencies from top (DMD) electrodes and solid lines are of light extraction efficiencies from bottom (ITO) electrodes. Large differences in the light extraction efficiency from the bottom (ITO) electrodes are observed for differences in the distance between the dipoles and the metal layer of the DMD electrode. At λ=535 nm (green QD-LEDs), the light extraction efficiency increases from f=0.095 at $t_{ZnO}$=15 nm to f=0.14 at $t_{ZnO}$=50 nm, and decreases as the distance increases due to the inner ZnO layer thickness, with f=0.03 calculated when $t_{ZnO}$=125 nm. In contrast, differences in the light extraction efficiency from the top DMD electrodes are minimal upon varying the inner ZnO layer thickness. The simulated luminance ratio of the emitting light, calculated from the light extraction efficiency of the two transparent electrodes permits calculation of a simulated luminance ratio, $L_{top}/L_{bottom}$, as a function of the ZnO spacer thickness, as shown in FIG. 21. The simulated ratio decreases slightly from 0.43 at $t_{ZnO}$=15 nm to 0.33 at $t_{ZnO}$=50 nm and sharply increases from 0.33 at $t_{ZnO}$=50 nm to 1.5 at $t_{ZnO}$=125 nm.

Transparent QD-LEDs with various inner ZnO layer thicknesses were fabricated and characterized where the ZnO thickness was varied from $t_{ZnO}$=20 nm to $t_{ZnO}$=120 nm by spin-coating using ZnO nanoparticle ethanol solution with different concentrations (30 and 60 mg/mL) and different spin speeds (1 k, 2 k, 4 k, and 8 k rpm), with the ZnO nanoparticle layer thicknesses calibrated using ellipsometry. The luminance ratio of the emitting light is plotted in FIG. 21. The experimental and simulated ratios quantitatively and qualitatively agreed. The position that a micro-cavity effect within the multilayer stack is responsible for the difference in light extraction efficiency is consistent with this agreement, which leads to a direction for tuning the luminous flux ratio of the two emission directions.

Figure 22:
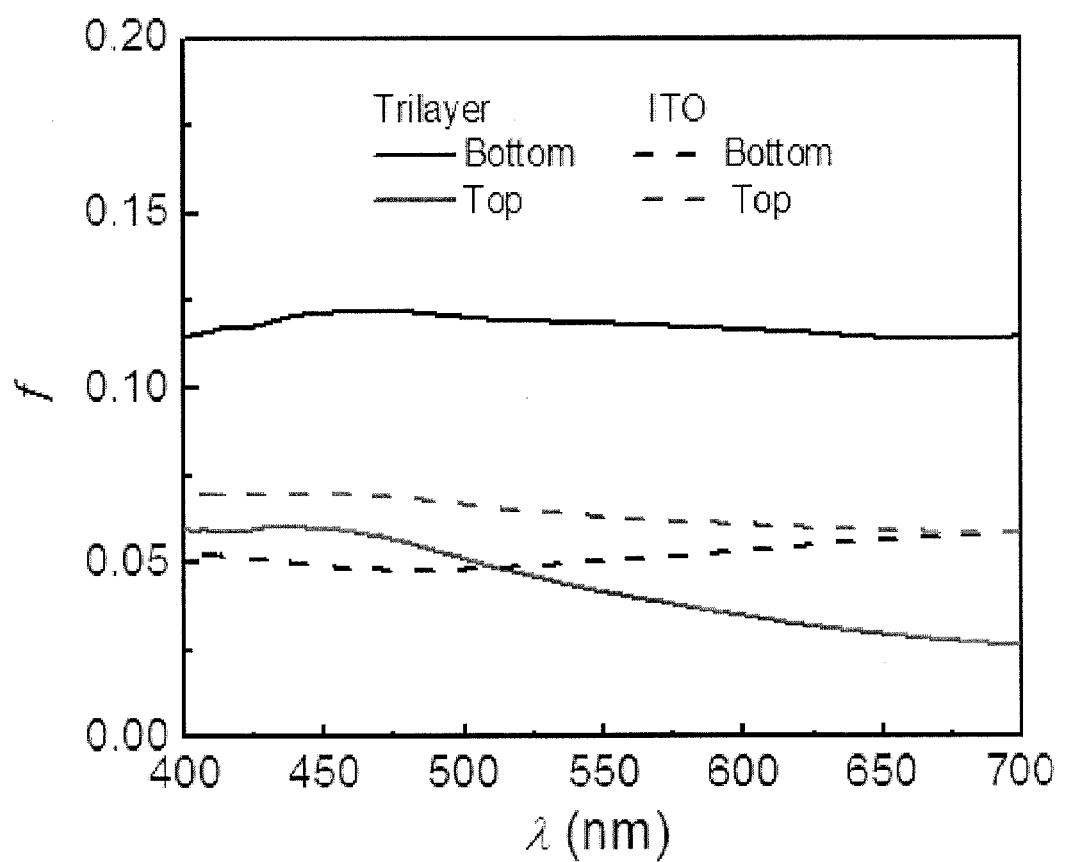
FIG. 22 shows plots of light extraction efficiency for a simulated transparent QD-LED with DMD and ITO electrodes, according to an embodiment of the invention, and a simulated transparent QD-LED with two ITO transparent electrodes.

The advantage of a device according to embodiments of the invention that display a micro-cavity effect is apparent in the simulated comparison of a transparent QD-LED having a DMD electrode and an ITO with a transparent QD-LED having two equivalent ITO electrodes. As indicated by dashed lines in FIG. 22, light extraction efficiencies from top and bottom ITO electrodes are about the same level, f≈6.5%, whereas the DMD comprising device has significant differences in the light extraction efficiency from the two electrodes, 6% for the DMD electrode and 13% for the ITO electrode. Therefore, having a micro-cavity effect within the transparent QD-LED with DMD electrode helps improve the light extraction efficiency from the bottom ITO electrode and therefore improve the total device efficiency for a desired viewing face, such as needed for many applications of a transparent QD-LED, such on a windows of a car or airplane.

Methods and Materials

Nanoparticles of ZnO were synthesized by dropwise addition of a stoichiometric amount of tetramethylammonium hydroxide dissolved in ethanol (0.55M) to 30 mL of 0.1M zinc acetate dihydrate dissolved in DMSO followed by stirring for an hour at room temperature. After washing multiple times in heptane/ethanol with a 1:3 volume ratio, ZnO nanoparticles were dispersed in pure ethanol.

CdSe/ZnS quantum dots having an emission peak at 524 nm (green), 0.1 mmol of CdO and 4 mmol of zinc acetate were mixed with 5 mL of oleic acid in a 50 mL flask, heated to 150° C., and degassed for 30 min. Subsequently, 15 mL of 1-octadecene was injected into the reaction flask and heated to 300° C. while the reaction vessel was maintained under pure, dry nitrogen. At a temperature of 300° C., 0.2 mmol of Se and 3 mmol of S dissolved in 2 mL of trioctylphosphine was swiftly injected into the vessel. After 10 min, 0.5 mL of 1-octanethiol was introduced into the reactor to passivate the quantum dots, and the temperature of the reactor was lowered to room temperature. After purification, the resulting CdSe/ZnS quantum dots were dispersed in toluene.

All conventional and transparent devices were fabricated on glass substrates pre-coated with ITO. Prior to use, all substrates were cleaned by successive ultrasonic treatment in tergitol/DI-water solution, DI-water, acetone, and isopropanol, followed by treating under UV-ozone for 15 minutes. For conventional and transparent QD-LED devices, a 40 nm thick poly(3,4-ethylenedioxythiophene): poly(styrenesulfonate) (PEDOT:PSS, AI 4083) layer was spin-coated onto the cleaned substrates and annealed at 150° C. in air to remove residual water. A 45 nm thick poly[(9,9-dioctylfluorenyl-2,7-diyl)-co-(4,4'-(N-(4-s-butylphenyl))diphenylamine)] (TFB, American Dye Source) layer was deposited onto the PEDOT:PSS layer by spin-coating from a chloroform solution in a $N_2$ glove-box, followed by a thermal anneal at 150° C. Subsequently, a 15 nm thick CdSe—ZnS QDs layer and a ZnO nanoparticles layer were sequentially spin-coated from toluene and ethanol solutions, respectively, in a glove-box and annealed at 70° C. to remove the residual solvents. After deposition of the solution-processed layers, all devices were transferred to a vacuum deposition chamber with a maximum chamber pressure of $10^{-6}$ torr for electrode deposition. For conventional bottom emitting QD-LEDs, a 100 nm thick Al layer was thermally evaporated onto the active layer, whereas, a 15 nm thick Ag and/or Au layer was deposited for transparent QD-LEDs, serving as the cathodes. For transparent QD-LEDs, a second ZnO layer (50 nm thick) was deposited on top of the thin metal layers by spin-coating from an ethanol solution. All devices were encapsulated with a UV-curable index matching polymers (n=1.5) and cover glasses.

Characterization of Films and Devices:

Optical transmittance (T) and reflectance (R) of films were calculated from the incident, transmitted and reflected light intensity generated by a monochromatic light. The light intensity was measured by a calibrated Newport silicon detector using a Stanford Research System 830DPS lock-in amplifier and a Keithley 428 current amplifier. Electroluminescence (EL) spectra were taken using an Ocean Optics HR4000 high-resolution spectrometer. Luminance (L)-current density (J)-voltage (V) characteristics of QD-LED devices were measured in ambient using an Agilent 4155C semiconductor parameter analyzer and a calibrated Newport silicon detector. Luminance was calibrated using a Konica Minolta LS-100 luminance meter with the assumption of Lambertian emission pattern. Power ($\eta_P$), and external quantum efficiencies ($\eta_{EQE}$) were calculated according to the recommended methods.

All patents, patent applications, and publications referred to or cited herein are incorporated by reference in their entirety, including all figures and tables, to the extent they are not inconsistent with the explicit teachings of this specification. It should be understood that the examples and embodiments described herein are for illustrative purposes only and that various modifications or changes in light thereof will be suggested to persons skilled in the art and are to be included within the spirit and purview of this application.

We claim:

1. A quantum dot light emitting diode (QD-LED) comprising:
   a light emitting layer comprising a plurality of quantum dots (QDs); and
   at least one dielectric/metal/dielectric (DMD) electrode comprising a first dielectric layer proximal to the light emitting layer, a metal layer and a second dielectric layer distal to the light emitting layer, wherein the first dielectric layer and the second dielectric layer comprise nanoparticles or polymer-nanoparticle blends, wherein the DMD electrode is a transparent cathode.

2. The QD-LED of claim 1, wherein said QDs comprise Group II-VI compound semiconductor nanocrystals, Group III-V or IV-VI compound semiconductor nanocrystals, $CuInS_2$, $CuInSe_2$ nanocrystals, metal oxide nanoparticles, core-shell structured nanocrystals, semiconductor nanocrystals doped with rare earth elements or transition metal elements or any combination thereof.

3. The QD-LED of claim 2, wherein said Group II-VI compound semiconductor nanocrystals comprise CdS, CdSe, CdTe, ZnS, ZnSe, ZnTe, HgS, HgSe, HgTe, CdSTe, alloys thereof, or any mixtures thereof.

4. The QD-LED of claim 2, wherein said Group III-V or IV-VI compound semiconductor nanocrystals comprise GaP, GaAs, GaSb, InP, InAs, InSb, PbS, PbSe, PbTe, alloys thereof, or any mixtures thereof.

5. The QD-LED of claim 2, wherein said metal oxide nanoparticles comprise ZnO, $TiO_2$, or a combination thereof.

6. The QD-LED of claim 2, wherein said core-shell structured nanocrystals comprise CdSe/ZnSe, CdSe/CdS, CdSe/ZnS, CdS/ZnSe, CdS/ZnS, ZnSe/ZnS, InP/ZnS, ZnO/MgO, $CuInS_2$/ZnS, $CuInSe_2$/ZnS, alloys thereof, or any mixtures thereof.

7. The QD-LED of claim 2, wherein said semiconductor nanoparticles doped with rare earth element comprise Eu, Er, Tb, Tm, Dy or any combination thereof.

8. The QD-LED of claim 1, wherein said first dielectric layer comprises nanoparticles.

9. The QD-LED of claim 1, wherein said first dielectric layer comprises polymer-nanoparticle blends.

10. The QD-LED of claim 1, wherein said first dielectric layer comprises ZnO, $TiO_2$, $Cs_2O$, $MoO_3$, $WO_3$, NiO, $Cr_2O_3$, $V_2O_5$, or any combination thereof.

11. The QD-LED of claim 1, wherein said first dielectric layer comprises a polymer containing ZnO, $TiO_2$, $Cs_2O$, $MoO_3$, $WO_3$, NiO, $Cr_2O_3$, or $V_2O_5$.

12. The QD-LED of claim 1, wherein said first dielectric layer is 10 to 60 nm in thickness.

13. The QD-LED of claim 1, wherein said metal layer of said DMD electrode comprises Ag, Au, Al, Ca, Mg, Cu, Mo or Mg:Ag alloy.

14. The QD-LED of claim 1, wherein said metal layer of said DMD electrode is 5 to 25 nm in thickness.

15. The QD-LED of claim 1, wherein said second dielectric layer comprises ZnO, ZnS, ZnSe, $MoO_3$, $WO_3$, $TiO_2$, $Al_2O_3$, $V_2O_5$, $Cr_2O_3$, $SiO_2$, $SiN_x$, or any combination thereof.

16. The QD-LED of claim 1, wherein said second dielectric layer comprises polymer blends with ZnO, ZnS, ZnSe, $MoO_3$, $WO_3$, $TiO_2$, $Al_2O_3$, $V_2O_5$, $Cr_2O_3$, $SiO_2$, $SiN_x$, or any combination thereof.

17. The QD-LED of claim 1, wherein said second dielectric layer is 30 to 200 nm in thickness.

18. The QD-LED of claim 1, wherein light is emitted from the top and bottom faces of said QD-LED.

\* \* \* \* \*